United States Patent [19]

Burton

[11] 4,064,966

[45] Dec. 27, 1977

[54] LOUDSPEAKER APPARATUS

[76] Inventor: William D. Burton, 2946 Gertrude Ave., La Crescenta, Calif. 91214

[21] Appl. No.: 666,006

[22] Filed: Mar. 11, 1976

[51] Int. Cl.[2] .......... H05K 5/00

[52] U.S. Cl. .......... 181/144; 181/155

[58] Field of Search .......... 181/144–156

[56] References Cited

U.S. PATENT DOCUMENTS

| | | | |
|---|---|---|---|
| 3,136,382 | 6/1964 | Thaler | 181/146 |
| 3,326,321 | 6/1967 | Valuch | 181/144 |
| 3,393,764 | 7/1968 | Schafer | 181/146 |
| 3,688,864 | 9/1972 | Guss | 181/147 |

*Primary Examiner*—Stephen J. Tomsky

*Attorney, Agent, or Firm*—Roger A. Marrs

[57] ABSTRACT

A loudspeaker apparatus is disclosed herein having a sealed enclosure for housing a pair of multiple pairs of matched loudspeakers. The rear faces of the loudspeakers are effectively arranged so as to be directly exposed to each other via a tone chamber and operably coupled to be energized so as to move concurrently inward and outward. The respective pairs of loudspeakers having their effective radiation directed in the same direction along parallel longitudinal axis for radiating acoustical energy in a combined predetermined propagation pattern.

2 Claims, 4 Drawing Figures

Fig. 1
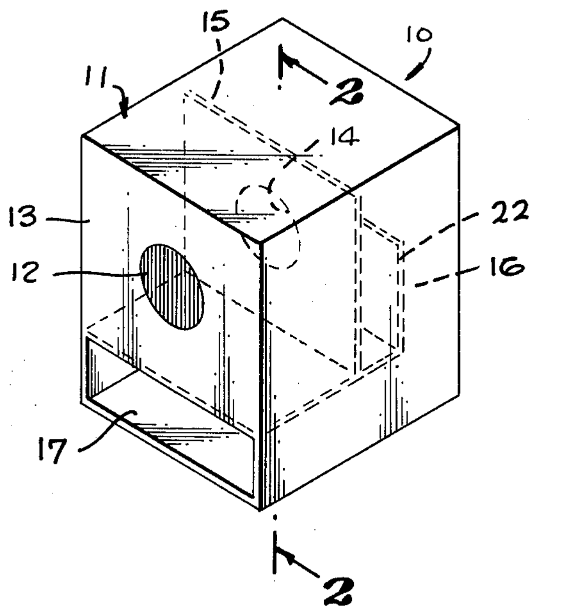
Fig. 3
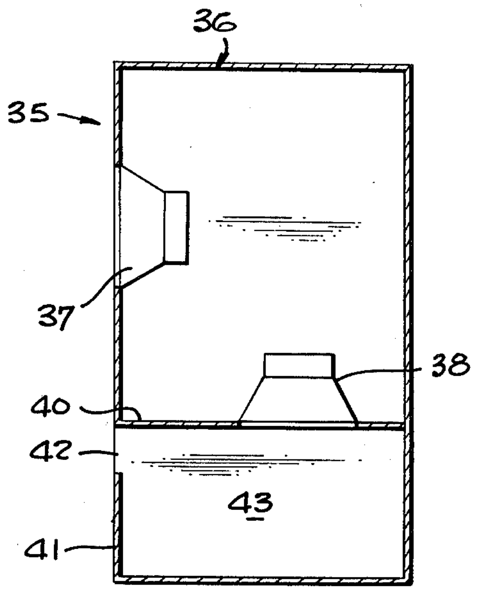
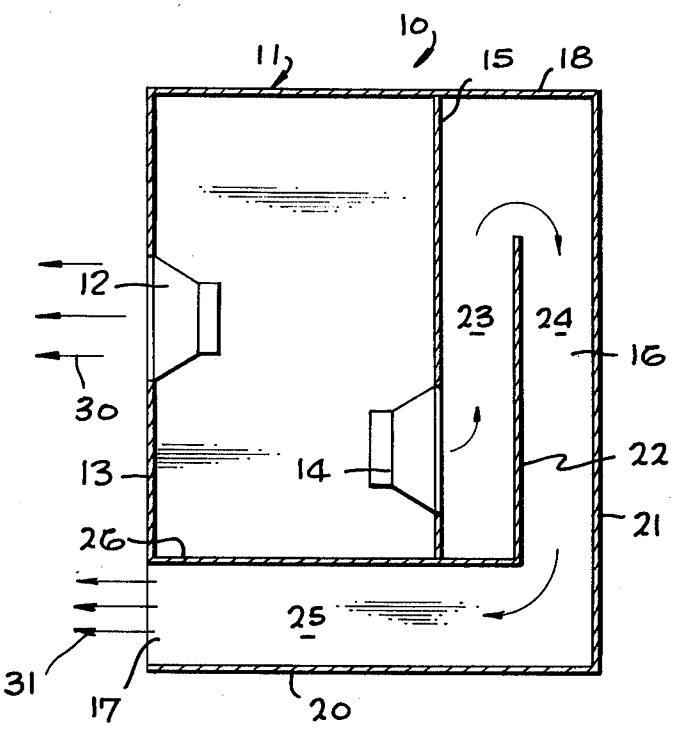
Fig. 2
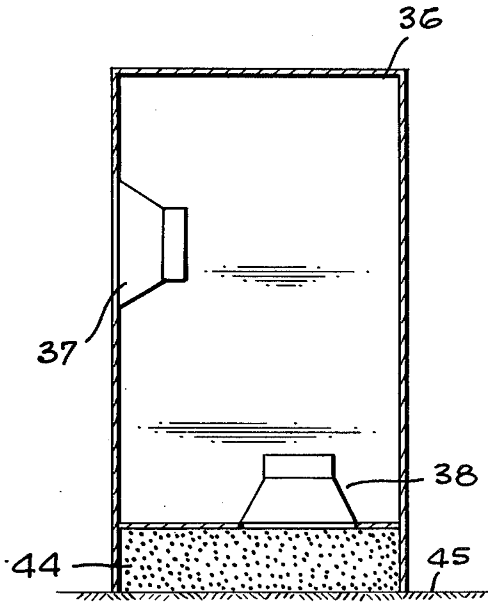
Fig. 4

LOUDSPEAKER APPARATUS

BACKGROUND OF THE INVENTION

1. Field of the Invention

This invention relates to electro-acoustical transducers and, more particularly, to a novel loudspeaker apparatus having a pair of diaphrams and having their rear sides connected by an elongated air passageway and being capable of generating improved acoustical wave energy distribution.

2. Description of the Prior Art

In the acoustic field a moving piston or "cone" almost universally used to generate lower register acoustic energy suffers from a drawback inherent in its mechanical construction. In motion, negative pressure is generated behind the cone as well as positive pressure in front of the cone. Unless suppressed in some manner this "back wave," as it is known, will cancel the desired "front wave," since it is equal and opposite in phase. This results in complete loss of lower audio tones and is completely unacceptable to a listener.

The simplest practical way to suppress the "back wave" is to enclose the loudspeaker in a rigid box. The stiffness of the enclosure is such that the pressures within the enclosure generated when the loudspeaker cone moves, are completely contained. This allows unhindered propagation of the front wave and all low register tones can be heard. This "enclosure" solution of the back wave problem is universally used today, in one of its several variations.

The stiffness of the air within the enclosure effectively reduces the compliance of the loudspeaker's moving member, which results in a very undesirable condition. Mechanically speaking, the mass of the moving element and its compliance result in a resonant condition. Electrically, this resonance results in a large rise in system impedance around the resonant frequency. This impedance rise can very easily reach 5 to 10 times the nominal value and results in very little power transfer from the driving source over the frequency range effected. Ideally, moving the resonance, due to moving mass and its concurrent stiffness, down to sub-sonic frequency is the answer to the problem. Physical limitations on the enclosure size and loudspeaker mechanical construction of the conventional equipment in use today render this condition essentially unattainable. System resonances almost invariably are within the audible spectrum.

Therefore, it is advantageous to remove the stiffening effect of the air within an enclosure, thus allowing the practical attainment of the very low resonant condition desired. Further, a means of utilizing the energy contained in the back wave, to re-inforce the front wave is desired.

In its simplest possible form a pair of back-to-back loudspeakers are so connected that their cones move simultaneously in the same direction. Volume change within the enclosure due to motion of the first cone is now zero since motion of the second one introduces a negative volume change exactly equal to the positive change due to the first cone. As is quite evident, this effect is only possible when the distance between cones is small compared to the wave length of the sound concerned. The effect of this zero volume change is zero pressure change within the enclosure, thus no stiffness is added to the mechanical system by the air within the enclosure. However, in this simplest form, cancellation effects due to the acoustic radiation of the pair of cones is still undesirable.

Prior art disclosures of this latter loudspeaker system are represented by U.S. Pat. Nos. 3,136,382 and 3,393,764.

Therefore, a need has long existed to provide an amplifying system including electro-acoustic transducers which will incorporate an infinite baffle approaching acoustical transparency whereby acoustical wave energy propagation and distribution are greatly improved.

SUMMARY OF THE INVENTION

Accordingly, the problems and difficulties encountered with prior loudspeaker systems are obviated by the present invention which provides an enclosure in which a pair of electro-acoustic transducers are fixed to the enclosure so as to seal and close the chamber thereof. The transducers are arranged in an effective back-to-back relationship and separated by the enclosure so that acoustic wave energy propagation radiates outwardly therefrom. The acoustic radiation from both transducers is in the same direction due to an air column associated with one transducer being folded over on itself. This latter air column may be referred to as an acoustic labyrinth that serves to reverse the phase of one transducer cone output at a desired frequency, thus adding its output to that of the other transducer cone.

Therefore, it is among the objects of the present invention to provide a novel loudspeaker system employing a novel electro-acoustic transducer apparatus having at least a pair of loudspeakers electrically coupled together out-of-phase and further including means for re-directing the acoustical wave energy from one of the loudspeakers into a parallel and in-phase wave propagation.

It is another object of the present invention to provide an enclosure having a pair of loudspeaker cones concurrently working inward and outward and having a resonant chamber coupled to the output of a selected one of the loudspeaker cones.

Still another object of the present invention is to provide a novel loudspeaker system having an enclosure housing a pair of loudspeakers arranged in a back-to-back relationship and including a folded air column for reversing and re-directing acoustical wave energy from one of the loudspeakers so as to be in the same direction as the wave radiation or propagation from the other loudspeaker.

The features of the present invention which are believed to be novel are set forth with particularity in the appended claims. The present invention, both as to its organization and manner of operation, together with further objects and advantages thereof, may best be understood by reference to the following description, taken in connection with the accompanying drawings.

BRIEF DESCRIPTION OF THE DRAWINGS

FIG. 1 is a perspective view of the novel loudspeaker system incorporating the present invention;

FIG. 2 is an enlarged cross-section view of the loudspeaker system shown in FIG. 1 as taken in the direction of arrows 2—2 thereof;

FIG. 3 is a transverse cross-sectional view of another embodiment incorporating the present invention; and FIG. 4 is a cross-sectional view of another embodiment of the present invention.

DESCRIPTION OF THE PREFERRED EMBODIMENT

Referring now in general to FIG. 1, the novel loudspeaker apparatus of the present invention is illustrated in the general direction arrow 10 which comprises an enclosure 11 housing the components thereof. As illustrated, the enclosure 11 includes a primary loudspeaker 12 which is mounted on a front panel 13 and a secondary loudspeaker 14 that is internally mounted on a wall or partition 15. Acoustical wave energy from loudspeaker 12 progresses outwardly while the acoustic wave energy from loudspeaker 14 is introduced into a confined air column indicated in general by numeral 16. The air column 6 carries and re-directs the wave energy through an elongated passageway and places radiation in the same direction as the wave radiation from loudspeaker 12 via an output mouth 17 at the end of air column 16.

Referring now in detail to FIG. 2, it can be seen that the loudspeaker 12 is carried on the front wall or panel 13 of enclosure 11 while loudspeaker 14 is carried in a substantially back-to-back relationship on wall or panel 15. The loudspeakers 12 and 14 may be co-axially displaced; however, in the present instance the loudspeakers are offset from their respective longitudinal axes and their respective cones concurrently move inward and outward. The radiating output from loudspeaker 14 is introduced into the air column 16 which may be said to be confined by a top wall portion 18, a bottom wall 20 and vertical side walls 15 and 21, respectively. In order to properly match wave lengths, the air column may be lengthened or shortened such as by providing an intermediate wall or partition 22 which separates the volume between the opposing wall surfaces of walls 15 and 21 so that the air column is elongated. In this instance, the air column comprises three portions indicated by first portion 23 confined between the opposing wall surfaces of walls 15 and 22, a second air column portion indicated by numeral 24 which is confined between the opposing wall surfaces of intermediate wall 22 and wall 21, and a third air column portion indicated by numeral 25 which is confined between the opposing wall surfaces of enclosure bottom 26 and apparatus bottom 20.

By this means, it can be seen that the acoustical wave energy radiating from loudspeaker 12 will be in the general direction of the arrows indicated by numeral 30. The acoustical wave energy radiating from loudspeaker 14 will be first introduced into first air column portion 23, then into air column portion 24 and then to air column portion 25 for discharge through the mouth 17 in the direction of arrows 31. It can be readily seen that when the length of the air column approaches a half wave length at a predetermined frequency range the direction of acoustical wave energy from loudspeaker 14 has now been re-directed so as to be combined or additive to the acoustical wave energy radiating from loudspeaker 12 over said predetermined frequency range.

An internal tone or sound chamber is defined by enclosure 11 which is confined between the opposing wall surfaces of walls 13 and 15 and the opposing wall surfaces of walls 11 and 26. The loudspeakers of the units 12 and 14 are operatively coupled in electrical out-of-phase relationship so that the respective vibrating cones move in unison. Therefore, the air column within the chamber moves back and forth in response to combined and simultaneous movement of the cones. The effect of the loudspeaker piston or cone movement is that neither vacuum nor pressure conditions are present. In a sense, loudspeaker 14 serves as a pressure relief pump.

By provision of air column 16, more efficient use of loudspeaker 14 is achieved. Air column 16 may be considered an acoustic labyrinth that serves to reverse the phase of a loudspeaker cone 14 at its output radiation at a desired frequency so that its output is added to that of loudspeaker cone 12. The result is re-enforcement of the acoustic output from loudspeaker 12 as well as elimination of enclosure stiffness. Loudspeaker 14 is electrically removed from the system by suitable cross-over devices to obviate interference problems resulting from two active loudspeakers when enclosure size becomes significant.

Referring now to FIG. 3, another embodiment of the same invention is illustrated in the general direction of arrow 35 which includes enclosure 36 for housing a pair of loudspeaker units 37 and 38. It is to be noted that loudspeaker unit 38 is carried on intermediate wall 40 and that this wall is in fixed spaced relationship with respect to a front lower wall 41 having an aperture or opening 42 formed therein. Acoustical wave energy emanating from loudspeaker 38 progresses into the Helmholtz resonator formed by volume 43 and port 42. In this manner, phase reversal of acoustic energy from 38 is achieved.

FIG. 4 illustrates an embodiment wherein the output from speaker 38 is directed into an absorbent or dissipating medium 44 or such as floor 45. Therefore, the enclosure functions as a pressure reducer and the sound absorbent means removes undesirable cancellation effects due to the phase opposition of the loudspeaker cones 37 and 38.

While particular embodiments of the present invention have been shown and described, it will be obvious to those skilled in the art that changes and modifications may be made without departing from this invention in its broader aspects and, therefore, the aim in the appended claims is to cover all such changes and modifications as fall within the true spirit and scope of this invention.

What is claimed is:

1. A loudspeaker apparatus comprising:

an enclosure having an internal sound chamber;

at least a pair of loudspeaker units secured in said sound chamber in fixed spaced apart relationship, each of said loudspeaker units facing in opposite directions in back-to-back relationship;

an air column carried in said enclosure having one end terminating adjacent the front of a selected one of said loudspeaker units and the other end terminating in close proximity to said other loudspeaker unit and having a length so that acoustic wave energy radiation from said other loudspeaker unit and from said air column is additive over a predetermined frequency range;

said air column is folded over upon itself so as to reverse the radiation direction of acoustic wave energy radiating from said selected loudspeaker unit;

a partition fixly carried in said enclosure having opposite wall surfaces defining a portion of said air column;

said partition associated with said selected loudspeaker unit for elongating and folding said air column so as to achieve said reverse direction of acoustic wave energy radiation;

said partition further includes a wall separating adjacent portions of said air column and a third portion of said air column extending at a right angle to said adjacent portions;

each of said loudspeaker units includes a vibrating cone and wherein said cones are electrically coupled in an out-of-phase relationship so that said cones move in unison.

2. In a sound amplification and projection system having conventional vibrating cone loudspeakers, the combination comprising:

an enclosure having a sound chamber having a front wall, a rear wall and top and bottom walls joining the opposite ends of said front and rear walls in sealed relationship;

a first and a second of said loudspeakers carried by said front and rear walls respectively in back-to-back relationship so that acoustic wave energy radiates from said loudspeakers in opposite directions;

a confined air column carried by said enclosure for receiving acoustic wave energy radiated by said second loudspeaker and for re-directing said received acoustic wave energy into a propagation pattern parallel to and in the same direction as acoustic wave energy radiation from said first loudspeaker;

means coupling each of said loudspeakers in an electrical out-of-phase relationship so that air between said loudspeakers moves back and forth in unison in response to movement of said loudspeaker cones; and said confined air column includes partition means for lengthening said column and for reversing the direction of acoustic wave energy radiation from said second loudspeaker.

* * * * *